US009898567B2

(12) United States Patent
Salodkar et al.

(10) Patent No.: US 9,898,567 B2
(45) Date of Patent: Feb. 20, 2018

(54) AUTOMATIC LAYOUT MODIFICATION TOOL WITH NON-UNIFORM GRIDS

(71) Applicant: Synopsys, Inc., Mountain View, CA (US)

(72) Inventors: Nitin Dileep Salodkar, Bangalore (IN); Subramanian Rajagopalan, Bangalore (IN); Sambuddha Bhattacharya, Bangalore (IN); Shabbir Husain Batterywala, Bangalore (IN)

(73) Assignee: Synopsys, Inc., Mountain View, CA (US)

(*) Notice: Subject to any disclaimer, the term of this patent is extended or adjusted under 35 U.S.C. 154(b) by 363 days.

(21) Appl. No.: 14/629,303

(22) Filed: Feb. 23, 2015

(65) Prior Publication Data
US 2015/0248514 A1 Sep. 3, 2015

(30) Foreign Application Priority Data

Feb. 28, 2014 (IN) .......................... 1027/CHE/2014

(51) Int. Cl.
*G06F 17/50* (2006.01)
(52) U.S. Cl.
CPC ................. *G06F 17/5068* (2013.01)
(58) Field of Classification Search
USPC ........................................................ 716/122
See application file for complete search history.

(56) References Cited

U.S. PATENT DOCUMENTS

2006/0281221 A1\* 12/2006 Mehrotra ............ G06F 17/5077
438/107
2007/0240088 A1\* 10/2007 Tang ..................... G06F 17/504
716/122

OTHER PUBLICATIONS

Abercrombie, D. et al., "Restrictive Design Rules and Their Impact on 22nm Design & Physical Verification," *Proc. of Electronic Design Process Symposium*, Apr. 2009, 15 pages.
Aspvall, B. et al., "A Linear-Time Algorithm for Testing the Truth of Certain Quantified Boolean Formulas," *Information Processing Letters*, Mar. 1979, pp. 121-123, vol. 8, No. 3.
Boyer, D., "Symbolic Layout Compaction Review," *Proc. IEEE/ACM Design Automation Conf.*, Jun. 1988, pp. 383-389.
Heng, F.-L. et al., "A VLSI Artwork Legalization Technique Based on a New Criterion of Minimum Layout Perturbation," *Proc. Int. Symp. Physical Design*, Apr. 1997, pp. 116-121.
(Continued)

*Primary Examiner* — Eric Lee
(74) *Attorney, Agent, or Firm* — Fenwick & West LLP

(57) ABSTRACT

A method (and system) of automatically legalizing a circuit layout with layout objects in a presence of a plurality of non-uniform grids is disclosed. The method comprises generating a set of layout constraints comprising design rule constraints and gridding requirements based on the plurality of non-uniform grids. In addition, the method comprises processing the set of layout constraints to a feasible form using Boolean variables by determining infeasibility of the set of layout constraints, identifying infeasible layout constraints from the set of layout constraints, and resolving the infeasibility by a constraint relaxation process. Additionally, the method comprises generating an output circuit layout, for display to a user, by solving the set of layout constraints in the feasible form with standard linear program solvers.

28 Claims, 10 Drawing Sheets

(56) References Cited

OTHER PUBLICATIONS

Hochbaum, D. S. et al., "Simple and Fast Algorithms for Linear and Integer Programs with Two Variables Per Inequality," *SIAM Journal of Computing*, Dec. 1994, pp. 1179-1192, vol. 23, No. 6.

Lavin, M. et al., "Backend CAD Flows for 'Restrictive Design Rules'," *Proc. Int. Conf. Computer Aided Design*, IEEE, Nov. 2004, pp. 739-746.

Lee, J.-F. et al., "VLSI Layout Compaction with Grid and Mixed Constraints," *IEEE Trans. Computer-Aided Design of Integrated Circuits and Systems*, Sep. 1987, pp. 903-910, vol. 6, No. 5.

Tang, X. et al., "Technology Migration Techniques for Simplified Layouts with Restrictive Design Rules," *Proc. Int. Conf. Computer Aided Design*, Nov. 2006, pp. 655-660.

Yuan, X. et al., "Technology Migration Technique for Designs with Strong RET-Driven Layout Restrictions," *Proc. Int. Symp. Physical Design*, Apr. 2005, pp. 175-182.

* cited by examiner

AUTOMATIC LAYOUT MODIFICATION TOOL WITH NON-UNIFORM GRIDS

CROSS REFERENCE TO RELATED APPLICATION

This application claims the benefit of Indian Provisional Application No. 1027/CHE/2014, filed on Feb. 28, 2014, which is incorporated by reference herein in its entirety.

BACKGROUND

1. Field of Art

The disclosure generally relates to the field of electronic design automation (EDA), and more specifically to methods and apparatuses for automatic legalization of an integrated circuit layout on non-uniform grids.

2. Description of the Related Art

Advancements in process technology have impacted integrated circuit manufacturing in at least two key ways. Firstly, scaling of device geometry achieved through sub-wavelength lithography has facilitated the packing of more devices on a chip. Secondly, different fabrication process recipes have enabled the manufacturing of heterogeneous devices with different threshold and supply voltages on the same die. A consequence of these improvements, however, has been an explosion in the number of design rules that need to be obeyed in the layout. Instead of simple width and spacing rules, modern fabrication technologies prescribe complex contextual rules that have to be obeyed for manufacturability. The increase in the number of rules has complicated the task of creating design rule clean layouts, i.e., layouts that do not have design rule violations. Creating design rule clean layouts for digital circuit designs can be facilitated by the use of standard cell layouts as building blocks, and placement and routing tools that are extended to address the design rules.

Unfortunately, this approach may not be applicable to analog, mixed signal and RF circuit designs. Layouts for such designs are typically created manually using layout editors, and, because of the number and complexity of the design rules, checking and fixing (i.e., legalizing) them can become a laborious process.

Advanced processes (22 nanometers (nm) and below) bring new challenges to layout designs. These advanced processes employ restrictive design rules (RDR) where all shapes in some layers (especially polysilicon) have the same orientation, the same width, and the same pitch. To define where layout objects can be placed in a layer, grids can be specified for each layer in the layout. The grids could be specified in a horizontal, a vertical or both directions to define positional values. Unlike a single manufacturing grid in older processes, these RDRs impose layer specific grids. Thus, layouts now need to obey multiple grid constraints. Furthermore, the grids need not be uniform for a layer, but rather different grid pitches could be defined for the same layer at different locations in the design. The non-uniformity of the grids may arise out of design methodologies. For such layers, in addition to uniform grids, centerlines of rectangular portions of layout shapes may need to be incident on non-uniform grids (i.e., tracks). Similarly, via centers may need to be located at the intersection of the tracks of their corresponding bottom and top layers.

Therefore, there is a need for an improved concept providing a robust solution to the problem of layout editing, in a manner that avoids and fixes non-uniform grid constraints with a minimal perturbation from the original form.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

Figure 1:
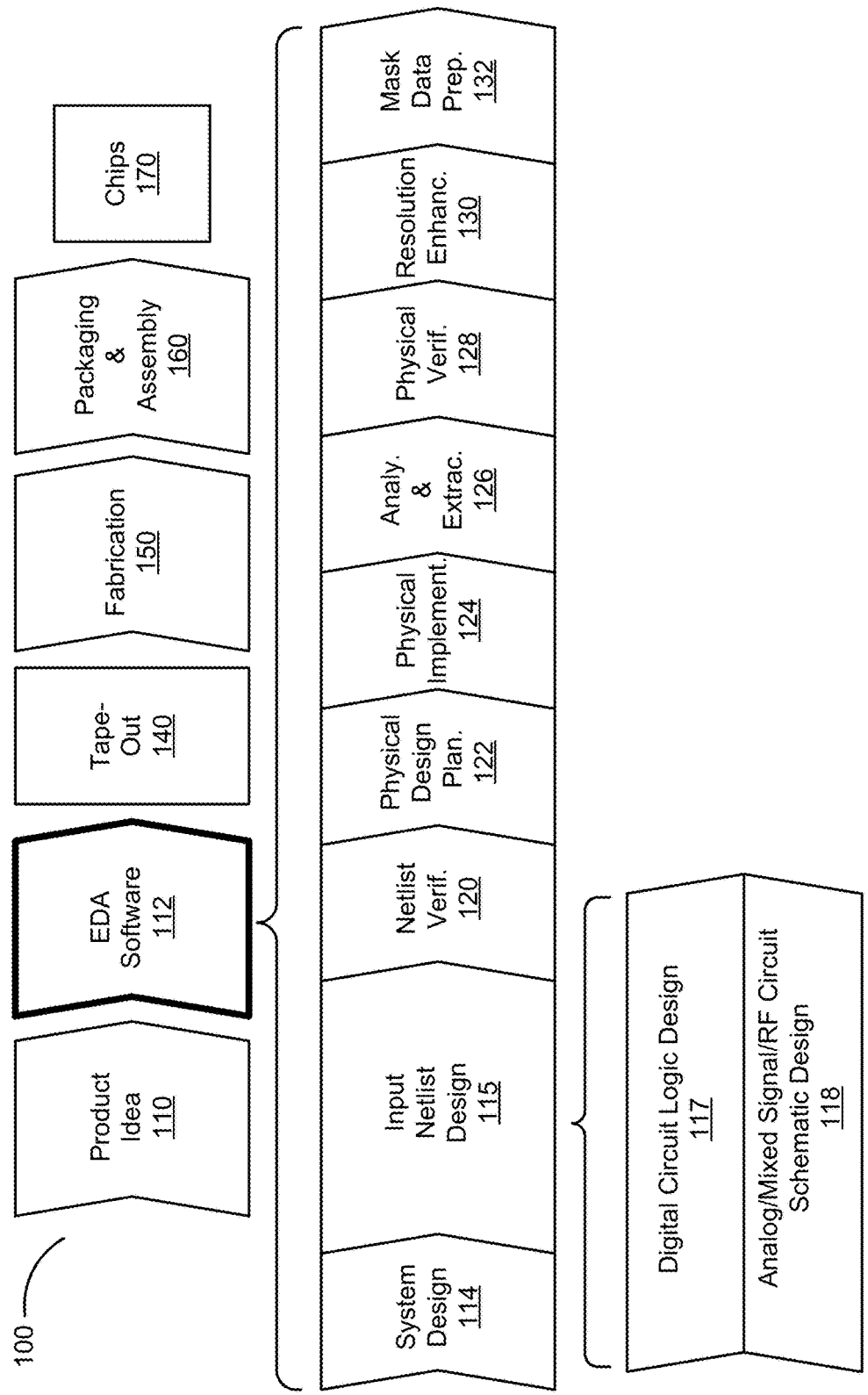
FIG. 1 illustrates one embodiment of an electronic design automation (EDA) design flow.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Configuration Overview

One embodiment of disclosed configurations includes a method (and system) for automatic layout modification with non-uniform grids to be used in a process of design and fabrication of an integrated circuit. The disclosed configuration can be employed in electronic design automation (EDA) software in the process of design of an integrated circuit.

The disclosed configuration enables automatic mechanisms of identifying layout constraints of layout objects and resolving the layout constraints using Boolean variables. One example configuration comprises generating a set of layout constraints based on a plurality of non-uniform grids. The set of layout constraints includes, for example, design rule check constraints and gridding requirements, where gridding requirements are requisites for a layout object to align to a grid. In addition, the configuration processes the set of layout constraints to a feasible form in which the layout object can be modified to satisfy the set of layout constraints. The configuration processes the set of layout constraints using the Boolean variables by (i) assigning the Boolean variables to layout variables that identify a position of a layout object, (ii) determining whether the set of layout constraints is infeasible using the Boolean variables, and (iii) responsive to the set of layout constraints determined to be infeasible, identifying an infeasible layout constraint from the set of layout constraints, the infeasible layout constraint causing the set of layout constraints to be infeasible, and relax the identified infeasible layout constraint for the set of layout constraints to be in the feasible form. Additionally, the configuration generates an output circuit layout, for display to a user, by solving the set of layout constraints in the feasible form with a standard linear program solver.

With the disclosed configuration, layout objects in a layout are automatically corrected to solve layout constraints. A layout object herein refers to a representation of a position and geometry of any circuit or routing element to be laid in order to construct a circuit. A layout variable herein refers to a positional value of a layout object. In addition, the disclosed configuration identifies infeasible layout constraints from a set of layout constraints by generating a Boolean implication graph based on the Boolean variables of the each of the layout variables, and checking for (or determining) satisfiability of the Boolean implication graph. The Boolean implication herein refers to a logical implication such that one condition leads to another condition (i.e., a→b). The satisfiability in terms of mathematical logic herein refers to a condition that one can find a binary assignment to the Boolean variables in a formula (or a statement) such that the formula (or the statement) evaluates to true. In addition, feasibility herein refers to a condition where a solution exists that satisfies all the set of layout constraints. Hence, infeasibility (or infeasible) herein refers to a condition that is not feasible.

In one example embodiment, a representation of a layout object is processed to assign variables to horizontal and vertical edges of layout edges. Using the assigned variables, a constraint graph is generated to indicate constraints (e.g., DRC constraints) applied to the layout object, where each constraint models a design rule across two layout edges. Due to conflicts in different constraints, the constraint graph could be infeasible (i.e., there is no solution to satisfy the constraints). Infeasibility of the constraint graph can be detected by, for example, performing Bellman Ford longest path run and finding positive cycles in the constraint graph. If a positive cycle is detected, then the infeasibility is resolved by relaxing one or more constraints in the positive cycle or replacing a value of the layout constraint restricting the layout object to be placed to a less restrictive value. Detecting whether the constraint graph is infeasible and relaxing one or more constraints can be iterated until no positive cycles are found in the constraint graph.

In the example embodiment, a range for each layout edge variable is computed to enable modeling of the gridding requirements. For computation of these ranges, forward and backward runs of layout aware Bellman Ford longest path algorithm may be implemented. The forward run provides one extreme value (e.g., leftmost position) for each layout positional variable, and the backward run provides another extreme value (e.g., rightmost) for each layout positional variable. In one approach, the longest path runs are performed in a manner that these ranges are as small as possible.

In the example embodiment, once the ranges are computed for each layout variable, valid grid positions in these ranges are identified. Each grid position is modeled by a Boolean variable. Each constraint in the infeasibility resolved constraint graph is converted into a set of Boolean implications using the ranges of the corresponding layout variables. Collectively the set of Boolean implications is checked for satisfiability using a 2SAT solver. The 2SAT solver computes Strongly Connected Components (SCC) and determines whether a SCC contains a Boolean variable and its compliment in it. The SCC containing a Boolean variable and its compliment indicates infeasibility in the gridding requirements. The infeasibility in the gridding requirements is resolved by relaxing the grid constraint (e.g., either locking the layout edge to its current value of the gridding requirement, or dropping the gridding requirement on it). Detecting whether the gridding requirements is infeasible and relaxing the gridding requirements are iterated to resolve all gridding infeasibilities.

In the example embodiment, the output representation of the layout compliant with DRC constraints and gridding requirements on non-uniform grids is generated based at least in part on the Boolean variables. In one aspect, a minimum perturbation objective function is modeled using these Boolean variables. The overall Boolean implications are then modeled as a linear program (which is guaranteed to be feasible) and solved. The solution of linear program results into binary (or Boolean) values for Boolean variables. The solution of linear program is then transformed back to layout positional values for each variable. An output representation of the layout is generated using the transformed layout positional values, where the output representation of the layout is compliant with DRC constraints and grid requirements.

Overview of EDA Design Flow

Referring now to FIG. 1, illustrated is a flowchart 100 illustrating the various operations in the design and fabrication of an integrated circuit. This process starts with the generation of a product idea 110, which is realized during a design process that uses EDA software 112. When the design is finalized, it can be taped-out 140. After tape-out 140, a semiconductor die is fabricated 150 to form the various objects (e.g., gates, metal layers, vias) in the integrated circuit design. Packaging and assembly processes 160 are performed, which result in finished chips 170.

The EDA software 112 may be implemented in one or more computing devices. For example, the EDA software 112 is stored as instructions in the computer-readable medium which are executed by a processor for performing operations 114-132 of the design flow, which are described below. This design flow description is for illustration purposes. In particular, this description is not meant to limit the present disclosure. For example, an actual integrated circuit design may require a designer to perform the design operations in a different sequence than the sequence described herein.

During system design 114, designers describe the functionality to implement. They can also perform what-if planning to refine the functionality and to check costs. Note that hardware-software architecture partitioning can occur at this stage. Example EDA software products from Synopsys, Inc.

of Mountain View, Calif. that can be used at this stage include: Model Architect®, Saber®, System Studio®, and Designware® products.

During input netlist design 115, the designers construct an input netlist of an intended circuit (or system). The input netlist design 115 may include different steps for digital circuit logic design 117 and analog/mixed signal/RF circuit schematic design 118. In case of digital circuit logic design 117, circuit components and configurations may be automatically obtained via logic design and functional verification step, and synthesis and design for test step. During the logic design and functional verification step, VHDL or Verilog code for modules in the circuit is written and the design is checked for functional accuracy. More specifically, the design is checked to ensure that it produces the correct outputs. Example EDA software products from Synopsys, Inc. of Mountain View, Calif. that can be used at this stage include: VCS®, Vera®, 10 Designware®, Magellan®, Formality®, ESP® and Leda® products.

During the synthesis and design for test step, VHDL/Verilog code is translated to an input netlist. This input netlist can be optimized for the target technology. Additionally, tests can be designed and implemented to check the finished chips. Example EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

In case of analog/mixed signal/RF circuit schematic design 118, the input netlist of the intended circuit (or system) including circuit components and configurations (e.g., active and passive components, connections, ports and etc.) is manually constructed. The input netlist can be manually coded in a vendor specific or neutral netlist format. Alternatively, the input netlist can be constructed as a schematic using a tool that (i) provides a visual representation of a schematic of a circuit and (ii) extracts an input netlist according to the schematic. In addition, an input netlist obtained from the analog/mixed signal/RF circuit schematic design maybe combined with another input netlist obtained from the digital circuit logic design 117. Example EDA software products from Synopsys, Inc. of Mountain View, Calif. that can be used at this stage include: Galaxy Custom Designer® SE and Laker products.

During netlist verification 120, the input netlist from the input netlist design 115 is checked for compliance with design requirements or specifications. For digital circuits and systems design, the input netlist is checked for timing constraints and for correspondence with the VHDL/Verilog source code. In case of analog/mixed signal/RF circuits the input netlist is simulated with a circuit simulator to check whether design requirements and specifications are met. In case the design requirements or specifications are not met, the designers may return to the system design 114 or the input netlist design 115 and repeat the process. Example EDA software products from Synopsys, Inc. of Mountain View, Calif. that can be used at this stage include: Formality®, Primetime®, VCS®, HSPICE®, and Galaxy Custom Designer® SE products.

During physical design planning 122, an overall floor plan for the chip is constructed and analyzed for timing and top-level routing. Example EDA software products from Synopsys, Inc. of Mountain View, Calif. that can be used at this stage include: Astro® and IC Compiler® products.

During physical implementation 124, the placement (positioning of circuit elements) and routing (connection of the same) occur. For digital circuits, automatic place and route EDA tools are used. For analog/mixed signal/RF circuits layout editor tools are used. Example EDA software products from Synopsys, Inc. of Mountain View, Calif. that can be used at this stage include: the Astro®, IC Compiler®, Galaxy Custom Designer® and Laker LE products.

During analysis and extraction 126, the circuit function is verified at a transistor level considering the placement and geometry of circuit elements, routing, and etc. In case the design requirements or specifications are not met, the designers may return to the system design 114, the input netlist design 115 or the physical implementation 124 and repeat the process. Example EDA software products from Synopsys, Inc. of Mountain View, Calif. that can be used at this stage include: Astrorail®, Primerail®, Primetime®, and Star RC/XT® products.

During physical verification 128, the design is checked to ensure correctness for: manufacturing, electrical issues, lithographic issues, and circuitry. Example EDA software products from Synopsys, Inc. of Mountain View, Calif. that can be used at this stage include the Hercules® product.

During resolution enhancement 130, geometric manipulations of the layout are performed to improve manufacturability of the design. Example EDA software products from Synopsys, Inc. of Mountain View, Calif. that can be used at this stage include: Proteus®, Proteus®AF, and PSMGED® products.

During mask-data preparation 132, the 'tape-out' data for production of masks to produce finished chips is provided. Example EDA software products from Synopsys, Inc. of Mountain View, Calif. that can be used at this stage include the CATS® family of products.

Embodiments of the present disclosure can be used during one or more of the above-described stages. Specifically, in some embodiments the present disclosure can be used in EDA software 112 that includes operations between physical implementation 124 and physical verification 128.

Example Method for Automatic Layout Modification on Non-Uniform Grids

In the process of circuit layout and layout editing, limitations in lithography at 20 nm and below necessitate non-uniform grids. Layout shapes on a mask layer need to comply with the grids defined on that layer. A layout can be thought of as a collection of shapes in various mask layers. For a layout to be correctly fabricated it needs to also obey all the design rules like minimum width, minimum spacing, via sizes, minimum extension of metal over via, spacing between transistor diffusions, width of transistor gates, extension of wells over diffusions, etc. Layout legalization herein refers to a process of automatically modifying a layout to make it compliant with all layer specific non-uniform grids and design rules. Such legalization tools fracture layout shapes into rectangles. Each rectangle edge is considered as a positional variable (i.e., layout variable). Thus, each rectangle has four positional variables associated with it, two of each in the horizontal and the vertical directions. A constraint graph is built with each positional variable as a node, and each design rule as an edge. An edge denotes a manufacturing constraint between the associated layout positional variables. In conventional legalization methods, general design rule constraints are handled by a design rule check (DRC), in which the design rule constraints are formulated as difference constraints. For instance, such design rules correspond to technology-dependent rules like spacing rules in one layer or spacing rules between several layers or various context dependent rules comprising single or multiple layers.

Figure 2A:
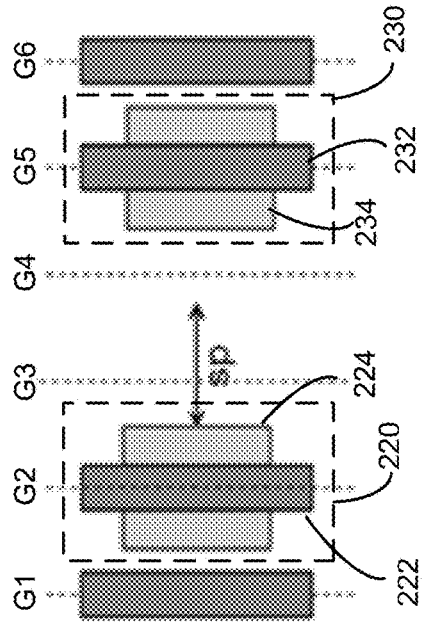
FIGS. 2A and 2B illustrate examples of layouts before and after legalization with uniform grids.
Figure 2B:
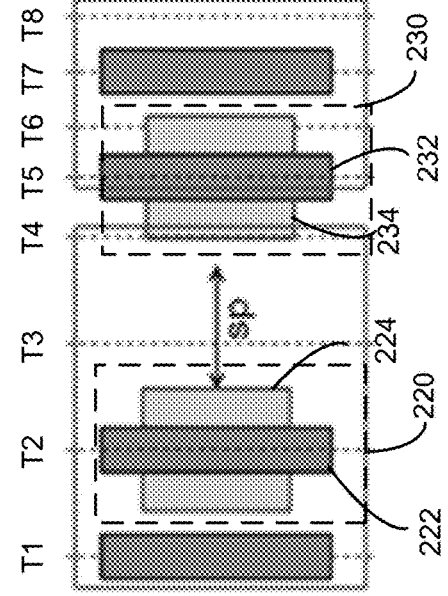

However, conventional legalization approaches do not take non-uniform grids into an account. Therefore, a layout may not be fixed in a grid compliant way or may not be optimized with the conventional legalization methods. For example, in FIGS. 2A and 2B, illustrated are a layout before and after legalizing with uniform grids. In FIG. 2A, uniform grids G1 to G6 identify positional values in the layout. For example, a first polisilicon area 222 with a first diffusion area 224 form a first transistor 220, and a second polisilicon area 232 with a second diffusion area 234 form a second transistor 230. The second transistor 230 violates a gridding requirement (i.e., a requirement for a layout object to snap to a grid), because a center line of the second transistor 230 is not on one of uniform grids G1 to G6. Preferably, the gridding requirement is satisfied while modifying the original layout by a minimal amount from an original spacing SP between the two transistors 220 and 230. As a solution, the second transistor 230 may be positioned such that the center line of the second transistor 230 is incident on the grid G5, according to the uniform grids G1 to G6.

Figure 2C:
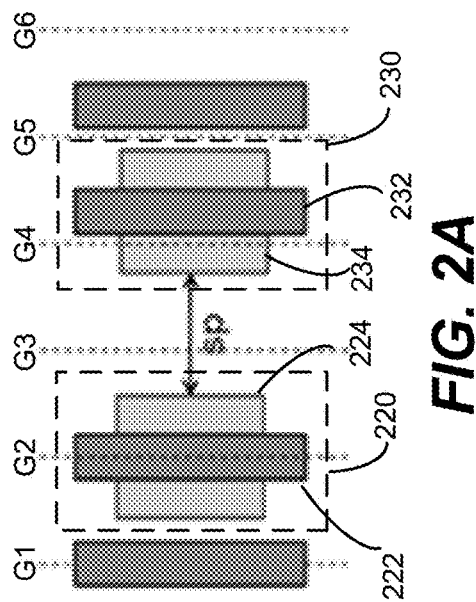
FIGS. 2C and 2D illustrate examples of layouts before and after legalization with non-uniform grids.
Figure 2D:
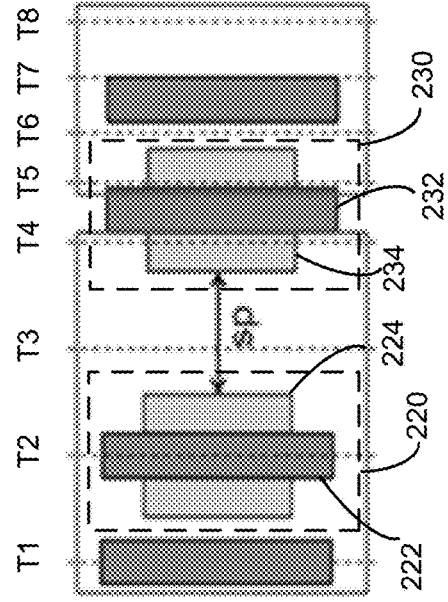

In FIGS. 2C and 2D, illustrated are layouts before and after legalization with non-uniform grids (i.e., tracks) according to a disclosed embodiment. FIG. 2C is similar to FIG. 2A, except tracks T1 to T8 identify positional values in the layout. The uniform grids G1, G2, G3, G4, G5 and G6 correspond to the tracks T1, T2, T3 T4, T6, and T8 respectively. Hence, additional tracks T5 and T7 identify additional positional values. In FIG. 2D, the layout is corrected such that the center line of the second transistor 230 is incident on the track T5. This resolves the gridding requirements while modifying the original layout by a minimal amount from an original spacing SP between the two transistors 220 and 230. Here, legalizing a layout using non-uniformly spaced tracks resulted in the lesser amount of change compared to legalizing the same layout using uniform grids as in FIG. 2B.

The general design rule constraints are of the form $x_i - x_j \geq w_{ij}$, where $x_i$ and $x_j$ are the positional variables (i.e., layout variables) corresponding to two rectangle edges, and wij corresponds to the required distance between the variables to obey the particular design rule. This results in the following linear program:

$$\text{minimize} \sum_{i=1}^{N} |x_i - x_j^0| \text{ subject to: } A\vec{x} \geq b,$$

where $\vec{x}$ is a column vector comprising of the variables corresponding to rectangle edges, $x_j^0$ is the rectangle edge position in the input layout. The matrix A is the coefficient matrix for the constraints, where each row Ai represents a single constraint. The vector b represents the rule values. The term $|x_i - x_j^0|$ models perturbation on the input layout. The objective function minimizes total perturbation across all layout edges. The resulting problem can be solved by a standard linear program solver (herein also referred to as "a regular linear program solver"). However, a standard linear program solver only guarantees integral solution, when the matrix A is Totally Uni-Modular (TUM). In an advanced fabrication process, each mask layer can have its own grid which can be non-uniform. Therefore, for a layout with non-uniform grids, the matrix A is no longer Totally Uni-Modular. To produce the matrix A in a TUM form, Boolean variables can be used to represent layout variables on the non-uniform grids, according to the disclosed method.

Figure 3A:
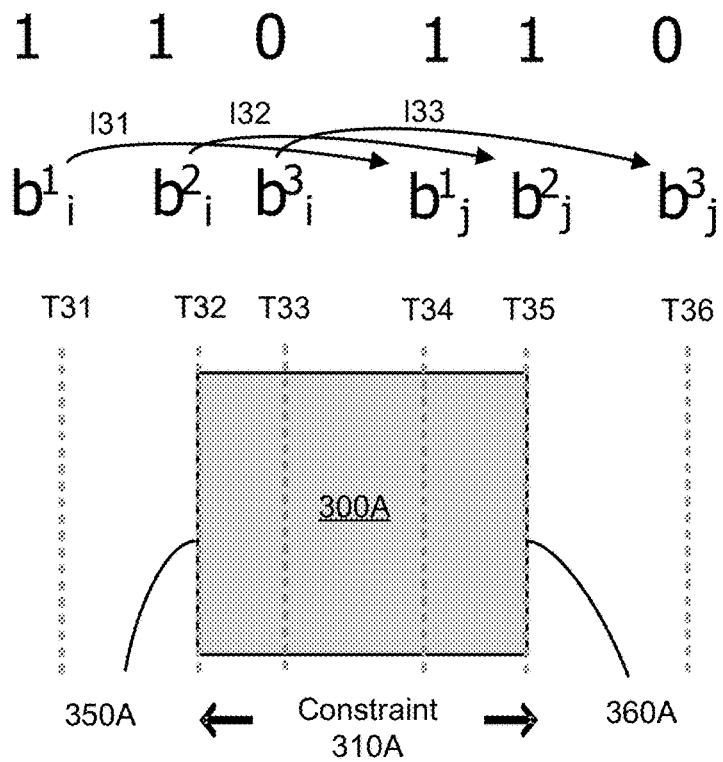
FIGS. 3A and 3B illustrate examples of Boolean variables for a left edge and a right edge of a layout rectangle.

Referring to FIG. 3A, illustrated are examples of Boolean variables for a left edge 350A and right edge 360A of a layout rectangle 300A in a shaded region. The width of the layout rectangle 300A represents a layout constraint 310A. The layout constraint may be a DRC constraint or a gridding requirement (i.e., a requirement to snap a layout object on a grid). The layout constraint 310A may represent a minimum or maximum spacing width between two layout variables, where one layout variable is the position of the left edge 350A of the layout rectangle 300A and the other layout variable is the position of the right edge 360A of the layout rectangle 300A.

The disclosed method finds out the ranges that each layout variable can take while still satisfying all the design rules as specified through the constraint graph. Within each range the available tracks are identified as valid positions for that layout variable. In FIG. 3A, the left edge 350A can be placed on any one of tracks T31, T32, and T33. Similarly, the right edge 360A can be placed on any one of tracks T34, T35, and T36. The tracks T31 to T36 are layer specific non-uniform tracks, and each track is assigned a Boolean variable. For example, the tracks T31, T32, and T33 are assigned to Boolean variables $b^1i$, $b^2i$, and $b^3i$, and the tracks T34, T35, and T36 are assigned to Boolean variables $b^1j$, $b^2j$, and $b^3j$. Hence, the Boolean variables $b^1i$, $b^2i$, and $b^3i$ form one set and the Boolean variables $b^1j$, $b^2j$, and $b^3j$ form another set. If the left edge 350A of the layout rectangle 300A is positioned on the track T31, then as per the layout constraint 310A the right edge 360A of the layout rectangle 300A should at least be positioned on the track T34, as indicated by a Boolean implication 131. Likewise if the left edge 350A of the layout rectangle 300A is positioned on the track T32, then the right edge 360A should at least be positioned on the track T35, as modeled by a Boolean implication 132. Similarly, if the left edge 350A is positioned on the track T33, then the right edge 360A should at least be positioned on the track T36, as modeled by a Boolean implication 133. In one implementation, if a Boolean variable for any track corresponding to the left edge 350A of the layout rectangle 300A is assigned a value '1,' it implies that Boolean variables for tracks positioned to the left of the track corresponding to the left edge 350A are also each assigned a value '1.' If the layout edge is assigned on a specific track by the constraint solver then Boolean variables for tracks to the right of that track are each assigned a value '0.'

For example, in FIG. 3A, the left edge 350A is positioned on the track T32, therefore the Boolean variable $b^2i$ is assigned a value '1.' Hence, the Boolean variable $b^1j$ is assigned a value '1,' and the Boolean variable $b^2i$ is assigned a value '0.' Similarly, the right edge 360A is positioned on the track T35, therefore the Boolean variables $b^1j$, $b^2j$, and $b^3j$ are assigned to '1,' '1,' and '0' respectively.

Figure 3B:
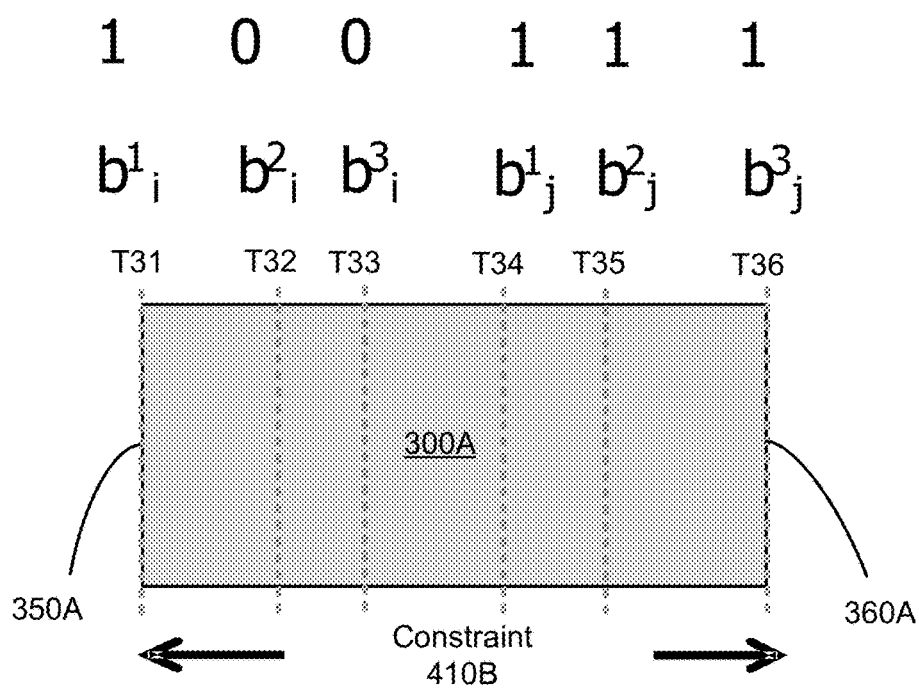

In FIG. 3B, illustrated is the Boolean variables of the layout rectangle 300A after solving collection of the Boolean implications 131 to 133 in FIG. 3A. If the Boolean variables $b^1i$, $b^2i$, $b^3i$, $b^1j$, $b^2j$, and $b^3j$ are assigned values as '1,' '0,' '0,' '1,' '1,' and '1,' respectively, then a left edge 350A of a layout rectangle 300A is positioned on the track T31 and a right edge 360A of the layout rectangle 300A is positioned on track T36. The representation of the Boolean values '1' and '0' are only one way of example of an embodiment, and can be represented in other forms.

As noted earlier, if a Boolean variable $b^pi$ is set to '1' then all Boolean variables corresponding to locations on the left of the location corresponding to $b^pi$ are also set to '1.' Let $b^{p-1}i$ be a Boolean variable corresponding to a location that is to the immediate left of the location corresponding to Boolean variable $b^p i$. Then $b^p i \ b \rightarrow b^{p-1} i$ ($\rightarrow$ stands for logical implication). Moreover, by skew symmetry, $!b^{p-1}i \rightarrow !b^p i$ ("!" stands for logical not operation). These Boolean implications are collected in an "implications set". Likewise each design rule is also modeled as a set of implications. In the example of FIG. 3A the implication 131 corresponds to $b^1 i \rightarrow b^1 j$. Whether a satisfiable value assignment can be achieved on the implications set such that all implications are satisfied is equivalent to solving a satisfiability problem. Since each implication contains only two Boolean variables, a 2-Satisfiability (2SAT) problem needs to be solved. This also implies that determining whether a constraint system is consistent is equivalent to determining a satisfiable assignment on the corresponding implications set. In order to determine whether a satisfiable assignment exists, an implication graph is used. Each Boolean variable and its complement are represented by two separate vertices in the graph. Implications form edges between these vertices.

Figure 4:
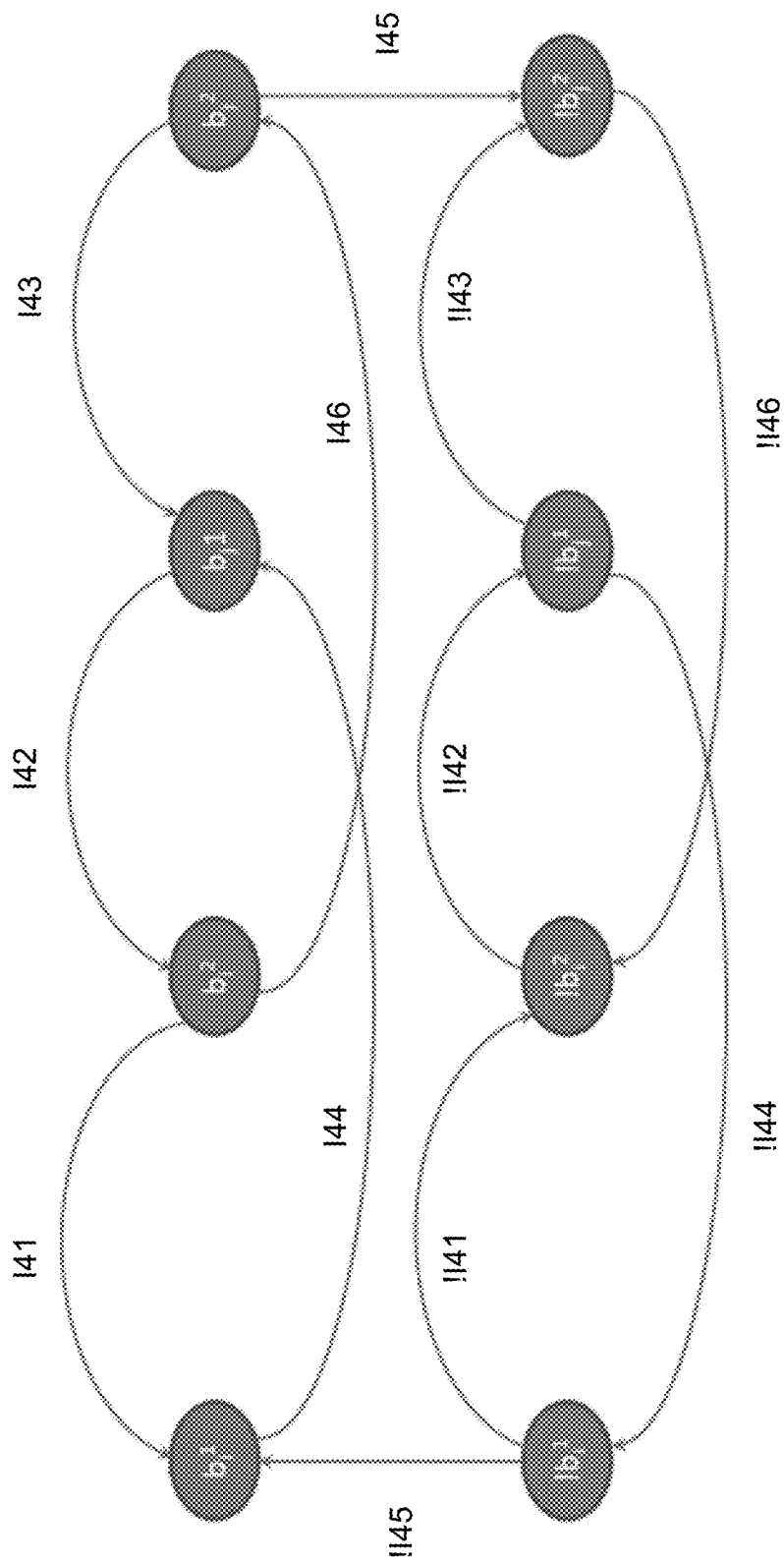
FIG. 4 illustrates an example of Boolean implication graph.

Referring to FIG. 4, illustrated is an example of a Boolean implication graph modeling a possible position of the layout object. In FIG. 4, implications I41, I42 and I43 correspond to $bi^2 \rightarrow bi^1$, $bj^1 \rightarrow bi^2$, and $bj^2 \rightarrow bj^1$, respectively. Additionally, implications I44 and I46 correspond to $bi^1 \rightarrow bj^1$, and $bi^2 \rightarrow bj^2$, respectively. By the skew symmetry, implications !I41, !I42, and !I43 imply that $!bi^1 \rightarrow !bi^2$, $!bi^2 \rightarrow !bj^1$, and $!bj^1 \rightarrow !bj^2$, respectively. Further, implications !I44 and !I46 imply that $!bj^1 \rightarrow !bi^1$, and $!bj^2 \rightarrow !bi^2$, respectively. In addition, implications I45 and !I45 imply that $bj^2 \rightarrow !bj^2$, and $!bi^1 \rightarrow bi^1$, respectively. Boolean implications can be used to identify feasibility or infeasibility of the set of layout constraints by checking for (or determining) satisfiability using a 2SAT solver. Infeasible sets are identified by determining the Strongly Connected Components (SCCs) of the implication graph. If a literal and its complement are present in the same SCC then the logic is not 2-Satisfiable, else it is 2-Satisfiable.

Generally, the constraint set obtained from a realistic layout is often infeasible due to conflicts between complex rules and design intents, lack of leeway in moving shapes due to placed macros, locked shapes, and sometimes due to incomplete modeling. Therefore, it is advantageous to detect and resolve such infeasibilities and obtain a set of solvable constraints. Infeasibility in the constraint graph over layout positional variables can be detected as a positively weighted cycle in the constraint graph. These positively weighted cycles can be identified through longest path runs. Constraints in the positively weighted cycle are usually relaxed to make the cycle non positive and hence resolve the corresponding infeasibility. Once all positively weighted cycles are resolved, the corresponding linear program becomes feasible and can be optimized for minimum perturbation objective.

Inconsistencies in the constraints express themselves as positively weighted cycles. These positive cycles are detected by invoking a single source longest path algorithm, e.g., the Bellman-Ford algorithm. The algorithm is applied iteratively until all positive cycles are detected and resolved. Advantageously, the longest path algorithm can be implemented, which is very efficient in practice.

Figure 5:
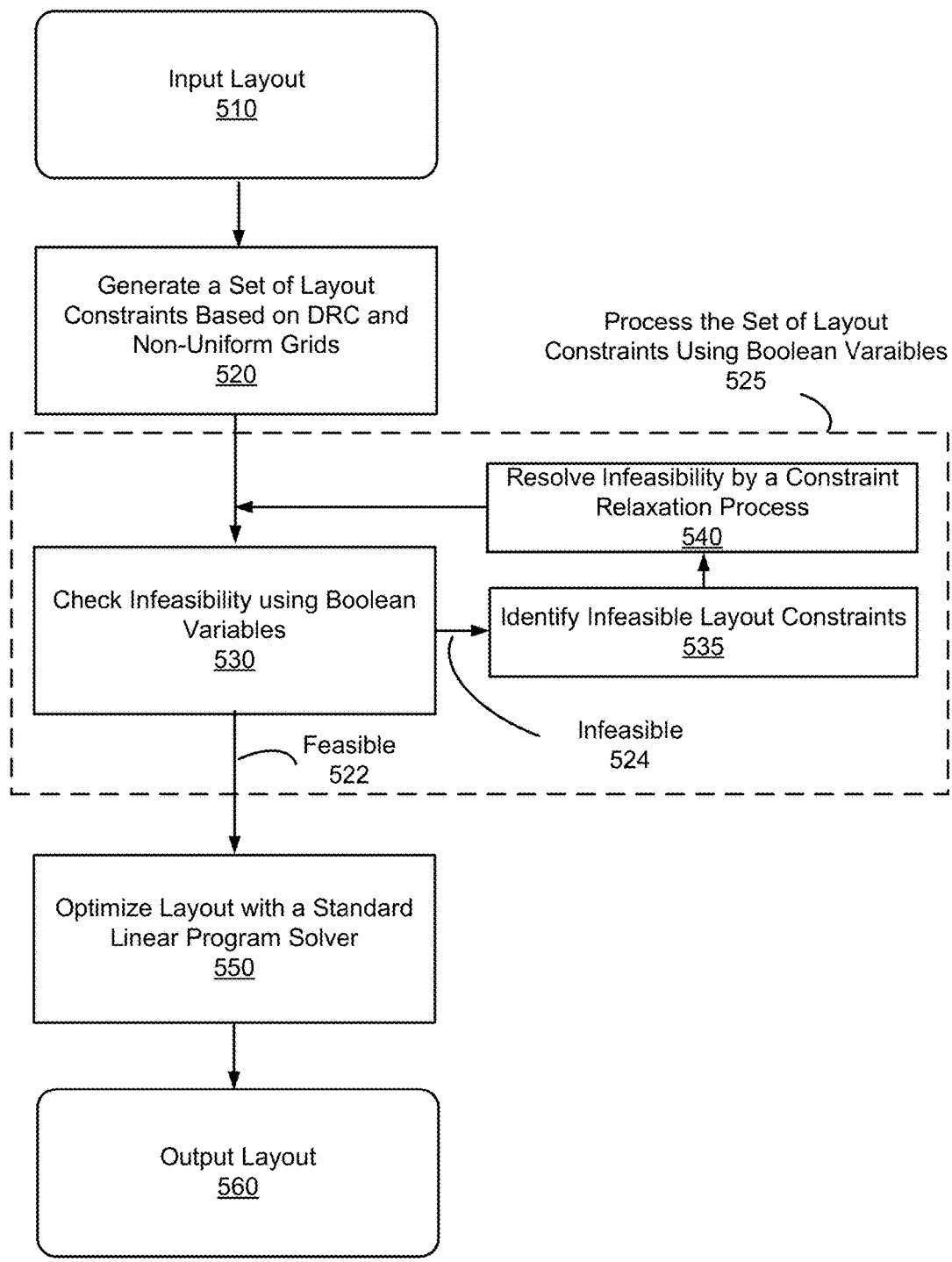
FIG. 5 illustrates an embodiment of a method for legalizing a layout with the non-uniform grids.

The disclosed method identifies and resolves infeasibilities in the presence of tracks. FIG. 5 shows an example of a flow-chart implementing a legalization method according to the improved concept. First, an integrated circuit layout including a plurality of layout objects (e.g., islands) are provided in an input layout step 510. As discussed above, such a circuit layout may be represented as a plurality of shapes or rectangles with positional variables (i.e., layout variables). Further, a set of layout constraints based on DRC and non-uniform grids are generated in step 520.

In addition, the set of layout constraints are processed using Boolean variables in step 525 to a feasible form. To describe step 525 in detail, the set of layout constraints are checked for infeasibility (or feasibility) using the Boolean variables in step 530. If the overall constraint set is determined to be infeasible 524 according to the set of variables, then infeasible layout constraints are identified from the set of layout constraints in step 535. Moreover, the infeasible layout constraints are resolved by relaxing the layout constraint via a constraint relaxation process in step 540. Hence, the relaxed layout constraint is checked again for the infeasibility in step 530. Steps 530, 535 and 540 are performed iteratively, until the set of layout constraints is feasible.

If the overall constraint set is found feasible in the iterative process in step 525, this set of constraints is provided to a standard linear program solver to optimize a layout, which becomes effective in step 550. The result of the linear program solver represents the output layout (herein also referred to as an "output circuit layout"), which is provided in step 560. The output layout may be provided for display to a user in a graphical representation as well. The output layout corresponds to a physical design of circuits to be fabricated.

Figure 6:
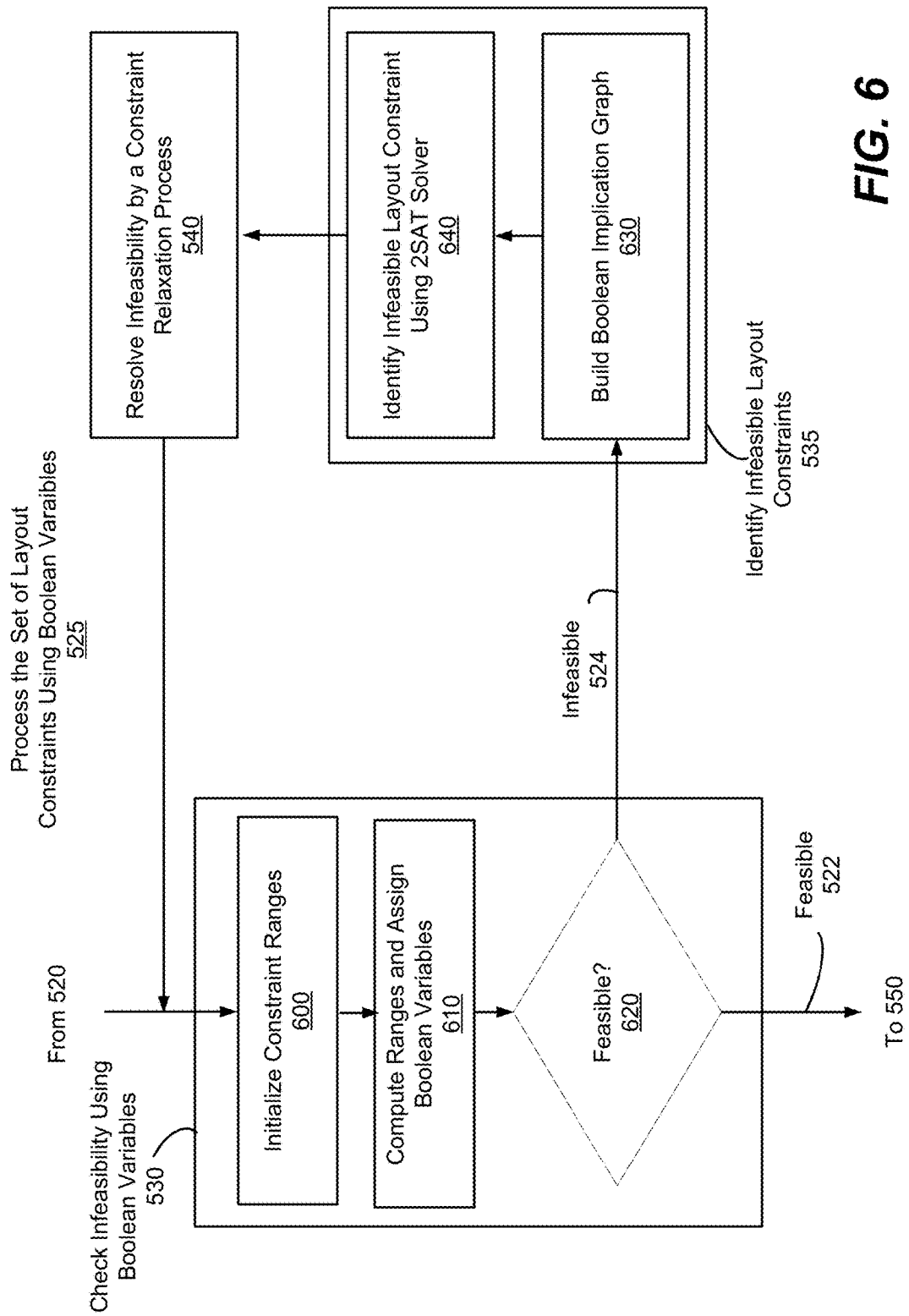
FIG. 6 illustrates an embodiment of processing the set of layout constraints using Boolean variables.

Referring to FIG. 6, illustrated is an embodiment of a method for processing the set of layout constraints using the Boolean variables in step 525. To check for infeasibility using the Boolean variables in step 530, constraint ranges for the layout constraints are initialized in step 600. In addition, the layout constraints generated in step 520 or step 540 are used to compute a constraint range for each layout constraint in step 610. Additionally, each layout variable is assigned (i.e., associated with) a Boolean variable. In one example, this computation is done by using a longest path type computation from a left-most layout edge first, and then by using a longest path type computation from a right-most layout edge. In one embodiment, the longest path type computation may employ Layout-aware Bellman-Ford Algorithm (LABF). Alternatively, the longest path type computation may employ Bellman-Ford Algorithm (BF). Additionally, infeasibility of the set of layout constraints is determined, by checking whether the range computation terminates or not in step 620. For example, if the range computation terminates, the constraints are feasible 522. On the other hand, if the range computation does not terminate, the constraints are infeasible 524.

In step 535, the infeasible layout constraints are identified. Specifically, Boolean implications are built from the yet computed ranges in step 630. Moreover, infeasible layout constraints are identified by checking for satisfiability using a 2SAT solver based on the Boolean implication graph in step 640. The 2SAT solver provides Strongly Connected Components, where each component corresponds to infeasibility. Original layout constraints are identified as causes of infeasibility and certain constraints are relaxed as needed to resolve the infeasibility in step 540. After all infeasibilities in the current iteration are resolved, range computation is reattempted in step 530. If the range computation terminates, then the constraints are solvable using the standard linear program solver in step 550. If the range computation does not terminate, then the process is repeated.

Figure 7:
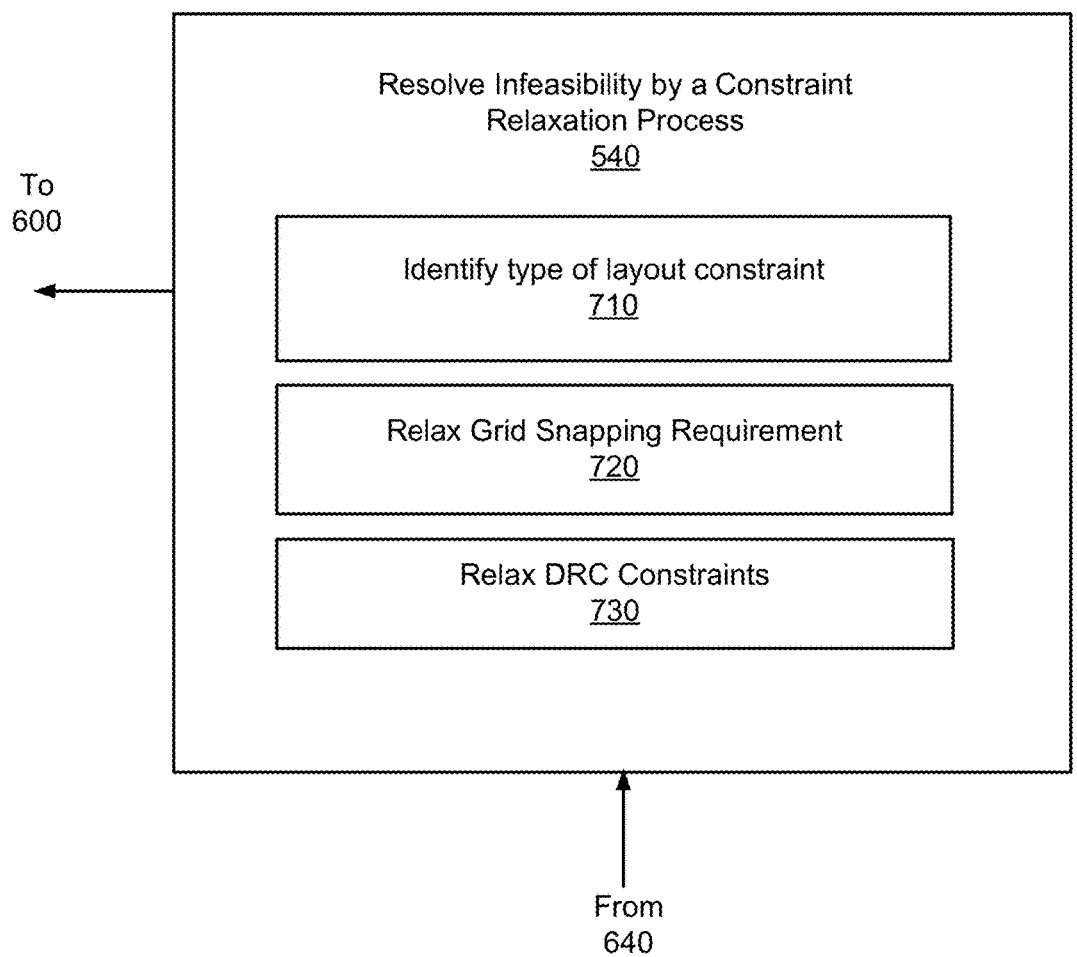
FIG. 7 illustrates one embodiment of a method for resolving infeasibility by a constraint relaxation process.

Referring to FIG. 7, illustrated is an embodiment of a method for resolving the infeasibility by the constraint relaxation process in step 540. Once the infeasible layout constraints are identified in step 640, a type of layout constraint for each of the infeasible layout constraints are identified in step 710. For example, the layout constraints can be classified into two types: a gridding requirement and a DRC constraint. For an infeasible layout constraint with the gridding requirement, the gridding requirement is relaxed gradually in step 720. In one approach, steps 720, 530 and 535 are repeated until the set of layout constraints are determined to be feasible 522. If the set of layout constraints are still infeasible 524 after relaxing the gridding requirements in all layout objects, the design rule constraints are gradually relaxed through the repeated steps of 730, 530 and 535 until a feasible problem is obtained. Relaxing the gridding requirement in step 720 ahead of relaxing the DRC constraints in step 730 indicates a priority for DRC over grid snapping. Alternatively, relaxing the DRC constraints in step 730 may be performed ahead of the relaxing gridding requirement in step 720. This indicates a priority for grid snapping over DRC. It is to be noted that, during the process, a gridding requirement, with any edge of a layout object which is already on the grid, is maintained without dropping. This ensures that additional gridding violations are not introduced in the already gridded layout edge. Likewise, a DRC constraint, with any edge of a layout object if satisfied, is maintained without relaxing. This again is to ensure that additional DRC violations are not introduced in an already DRC correct layout portion.

For feasibility, the total cycle weight needs to be made non-positive. This is achieved by reducing the weights of certain edges participant to the cycle. In other words, if the corresponding constraint value is larger than the associated layout value, it is diluted to the layout value. This dilution of constraints to input layout value is continued on other edges until the given cycle's weight becomes non-positive.

Resolution of positive cycles in this way has two interesting properties. First, if a constraint is not satisfiable, the input layout value is retained i.e., it is made no worse than how it started. Second, the input layout positions represent a feasible solution (albeit with relaxed or diluted constraints). Therefore, relaxing infeasible constraints to input layout value ensures termination of the infeasibility resolution step.

Figure 8:
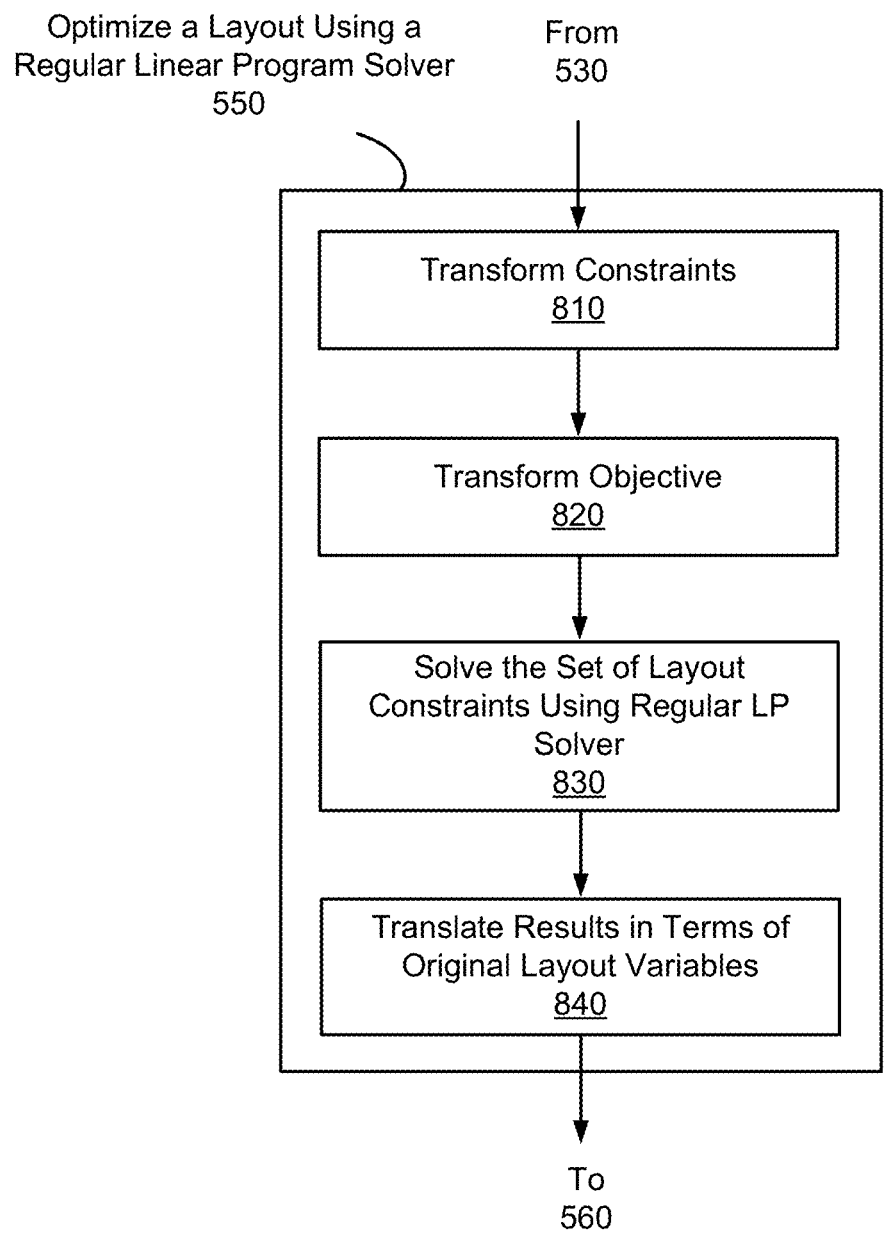
FIG. 8 illustrates one embodiment of a method for optimizing a layout using a standard linear program solver.

Referring to FIG. 8, illustrated is an embodiment of a method of optimizing the layout using the standard linear program solver in step 550, with the feasible set of layout constraints from step 530. With each layout variable associated with a Boolean variable in step 610 and Boolean implications obtained in step 630, the Boolean implications can be re-written (or transformed) as linear difference constraints in step 810. Moreover, the minimum perturbation objective function can also be re-written (or transformed) in terms of the Boolean variables in step 820. For example, the minimum perturbation objective function component for variable $x_i$ can be defined as:

$$|x_i - x_i^0| = \left( \sum_{p=1}^{C_i} (1 - b_i^p)\delta_i^p + \sum_{p=C_i+1}^{|x_i|} b_i^p \delta_i^p \right)$$

$$|x_i - x_i^0| = \left( -\sum_{p=1}^{C_i} b_i^p \delta_i^p + \sum_{p=C_i+1}^{|x_i|} b_i^p \delta_i^p \right).$$

where $x_i$ is a layout variable corresponding to a rectangle edge, and $x_i^0$ is a rectangle edge position in the input layout. The variable $b_i^p$ is the Boolean variable, and $\delta_i^p$ is the distance between p-th and (p−1)-th tracks. In addition, $C_i$ is the index of the input layout location of variable and $|x_i|$ is a set of layout variables. The total layout perturbation is the sum of perturbations for all layout variables. Because an edge can move in a one dimensional direction (e.g., horizontal or vertical direction) on the grid location, the above equation determines the perturbation from the current location based on the eventual output grid location that the positional variable would take.

In general, possible lower and upper bounds for locations that layout variables can take may be generated using two BF runs. However, BF runs fail to include all the minimum perturbation points. In contrast, the disclosed method determines the lower and upper bounds for locations that layout variables can take using a modified BF algorithm called as Layout Aware Bellman Ford (LABF) algorithm. LABF ensures that all minimum perturbation points are included in the determined ranges. Additionally, LABF takes non-uniform grids into account. The essence of this algorithm is that a variable is perturbed if dictated by a constraint. To achieve this, unlike BF, the variables are initialized with their initial layout locations. In a forward run of LABF, a variable is updated when a constraint pushes it to the right. Note that unlike BF, a forward LABF run coupled with track aware rounding, generates the upper bound. The reverse LABF with graph edges and weight signs inverted, generates the lower bound.

For example, if layout variables x1, x2, x3, and x4 have layout locations 0, 50, 50, and 100 respectively with constraints x2−x1≥40, x3−x1≥40, x4−x2≥60, and x4−x3≥60. The edges (or bounds) generated by the forward and reverse BF runs are listed in columns 3 and 4 (labeled BF LB and BF UB) in Table 1. The edges generated by the forward and reverse LABF runs are labeled LABF LB and LABF UB and listed in columns 5 and 6 of Table 1. Note that the lower and upper bounds include the minimum perturbation points for each variable.

TABLE 1

| Variable | Layout loc. | BF LB | BF UB | LABF LB | LABF UB |
|---|---|---|---|---|---|
| x1 | 0 | 0 | 0 | −10 | 0 |
| x2 | 50 | 40 | 40 | 40 | 50 |
| x3 | 50 | 40 | 40 | 40 | 50 |
| x4 | 100 | 100 | 100 | 100 | 110 |

In this example, the minimum perturbation solution is '0,' '50,' '50,' and '110,' for x1, x2, x3 and x4 respectively with a total perturbation of '10' units. However, it is not possible to achieve this minimum perturbation using the ranges in columns labeled BF LB and BF UB in Table 1 while satisfying constraints. This is because probable minimum perturbation solution points '50,' '50,' and '110' are missed out in ranges of variables x2, x3, and x4 respectively.

The edges generated by the forward and reverse LABF runs are listed in columns labeled LABF LB and LABF UB in Table 1. Note that the LABF UB provides minimum perturbation solutions with a perturbation of 10 units. Similarly, LABF LB provides minimum perturbation solutions if all variables are offset by 10 units. As a result, LABF according to the disclosed embodiment achieves a minimum perturbation.

Solving a linear optimization problem in terms of Boolean variables enables a constraint matrix A to be in a TUM form in step 830. Therefore, efficiency is improved compared to implementing an integer linear program solver to fix a layout with non-uniform grids. Furthermore, a solution with the Boolean variables from the standard linear program solver in step 830 is translated to the positional values on the non-uniform grid in step 840.

Beneficially, the disclosed configuration provides automatic design rule correction engines, which are an important aid in generating violation free layouts. The disclosed configuration efficiently identifies positional values utilizing Boolean representation. As a result, a constraint matrix can be formed in a TUM form, even with positional values on non-uniform grids. Hence, the disclosed configuration can efficiently solve a DRC correction problem on layouts with non-uniform grids using a simple linear program solver with minimum perturbation from an original layout.

The disclosed configuration becomes invaluable in an advanced process where non-uniform grids exist. For example in a FinFET process, transistors need to be aligned with the FIN locations, functioning as non-uniform grids. Without an ability to snap onto non-uniform grids as the disclosed embodiment, each FinFET has to be manually positioned to FINs appropriately according to DRC constraints. An attempt to edit a layout, in a local area of a large transistor network to fix a DRC constraint, can result in a series of incompliance with DRC constraints in large regions. Hence, the disclosed configuration improves efficiency in an integrated circuit design process by automatically modifying a layout with respect to non-uniform grids.

The advantages also include flexibility in integration with other existing EDA tools. For example, the disclosed configurations can also be integrated with a double pattern technology (DPT) fixing feature in Galaxy Custom Designer® or LAKER® from Synopsys, Inc., and be used in an advanced fabrication process that requires multiple patterns in the same layer.

Example System for Automatic Layout Modification on Non-Uniform Grids

Figure 10:
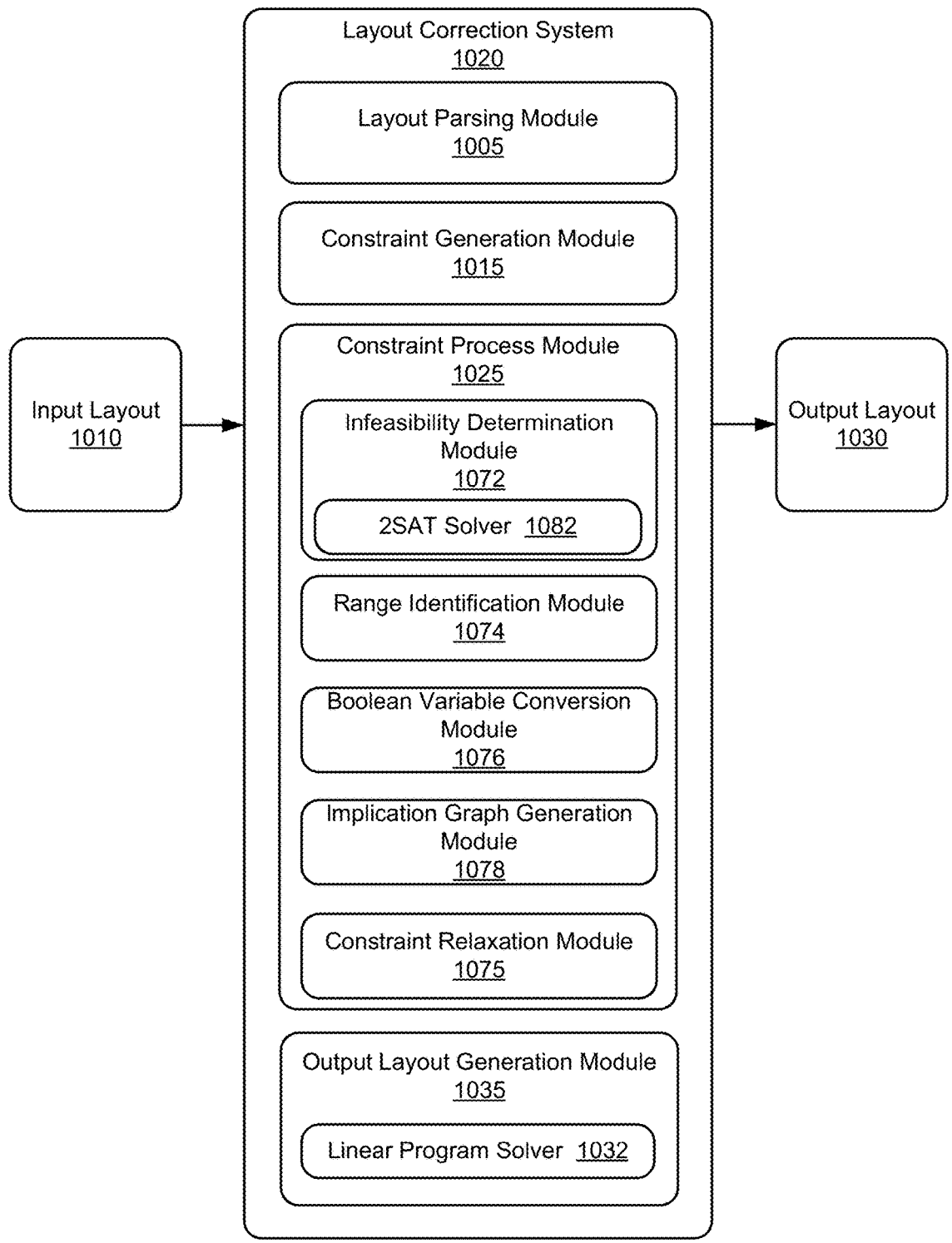
FIG. 10 illustrates one embodiment of a layout correction system for legalizing a layout with the non-uniform grids.

Referring to FIG. 10, illustrated is a layout correction system 1020 for legalizing a layout with the non-uniform grids, according to one embodiment. The layout correction system 1020 receives an electronic representation of an input circuit layout 1010 (herein generally referred to as an "input layout 1010") including layout objects, where the input layout 1010 that may fail one or more DRC constraints or gridding requirements. The layout correction system 1020 modifies the input layout 1010 to generate an electronic representation of an output circuit layout 1030 (herein generally referred to as an "output layout 1030") that is compliant with the DRC constraints and the gridding requirements.

In one embodiment, the layout correction system 1020 includes a layout parsing module 1005, a constraint generation module 1015, a constraint process module 1025, and an output layout generation module 1035. Each of these components may be embodied as hardware, software, firmware or a combination thereof. Together, these components perform a layout correction to generate the output layout 1030 compliant with the DRC constraints and the gridding requirements.

The layout parsing module 1005 receives the input layout 1010 and identifies a layout object having any arbitrary shape in the input layout 1010. In addition, the layout parsing module 1005 parses the layout object into one or more layout rectangles. In case the input layout 1010 is parsed into multiple rectangles already, the layout parsing module 1005 may be omitted.

The constraint generation module 1015 generates a set of layout constraints (DRC constraints and/or gridding requirements) for a layout object in the input layout 1010. The constraint generation module 1015 generates the set of layout constraints based on the non-uniform grids. For example, the constraint generation module 1015 generates the gridding requirement enforcing a layout object to align to one of the plurality of non-uniform grids.

The constraint process module 1025 processes the set of layout constraints to a feasible form for the layout object to be capable of being modified to satisfy the set of layout constraints. As illustrated in FIG. 10, the constraint process module 1025 comprises an infeasibility determination module 1072, a range identification module 1074, a Boolean variable conversion module 1076, an implication graph generation module 1078, and a constraint relaxation module 1075. Each of these components may be embodied as hardware, software, firmware or a combination thereof.

The range identification module 1074 identifies a possible range for an edge of a layout rectangle according to the DRC constraints and/or the gridding requirements. In one approach, the range identification module 1074 computes a range for each layout edge to be able to model the gridding constraint. For computation of these ranges, the range identification module 1074 employs forward and backward runs of Bellman Ford longest path algorithm. For example, the forward run provides one extreme value in one direction for each layout positional variable, and the backward run provides other extreme value in another direction for each layout positional variable.

The Boolean variable conversion module 1076 assigns Boolean variables to the layout variables. Each Boolean variable having a Boolean value is assigned to a corresponding layout variable having a numeric value. Accordingly, the Boolean variable conversion module 1076 converts layout variables to corresponding Boolean variables or Boolean variables to corresponding layout variables.

The implication graph generation module 1078 generates an implication graph based on layout constraints and Boolean variables. The implication graph generation module 1078 generates a Boolean implication graph based on Boolean variables having Boolean values. In addition, the implication graph generation module 1078 may generate an implication graph based on layout variables having numeric values.

The infeasibility determination module 1072 determines whether the set of layout constraints is infeasible. In one implementation, the infeasibility determination module 1072 includes a 2SAT solver 1082 configured to determine the infeasibility of the set of layout constraints using Boolean variables. In one aspect, the 2SAT solver 1082 computes Strongly Connected Components (SCC) of the Boolean implication graph and checks if an SCC contains a Boolean variable and its compliment in it. In case the SCC contains a Boolean variable and its compliment in it, the 2SAT solver 1082 determines the set of layout constraints is infeasible. Layout constraints containing the Boolean variables and their compliments in the SCC are identified as infeasible layout constraints. In another aspect, the infeasibility determination module 1072 uses an implication graph generated based on layout variables having numeric values for determining the infeasibility of the set of layout constraints.

If the set of layout constraints are determined to be infeasible, the constraint relaxation module 1075 relaxes the set of layout constraints to a feasible form. In one aspect, the constraint relaxation module 1075 relaxes the identified infeasible layout constraint for the set of layout constraints to be in the feasible form. For example, for an infeasible gridding requirement, the constraint relaxation module 1075 relaxes the gridding requirement by either locking the layout edge to its current grid value, or dropping the gridding requirement on it. Relaxing the set of layout constraints performed by the constraint relaxation module 1075 and determining whether the set of layout constraints is infeasible performed by the infeasibility determination module 1072 are iteratively performed until the set of layout constraints is feasible.

The output layout generation module 1035 generates the output circuit layout 1030 by solving the set of layout constraints in the feasible form from the constraint relaxation module 1075. In one implementation, the output layout generation module 1035 includes a standard linear program solver 1032 configured to model a minimum perturbation objection function of a layout object into Boolean implications as a linear program. The output of the linear program solver 1032 is in Boolean variables that may be converted to corresponding layout variables at the Boolean variable conversion module 1076 to generate the final output layout 1030.

Computing Machine Architecture

Figure 9:
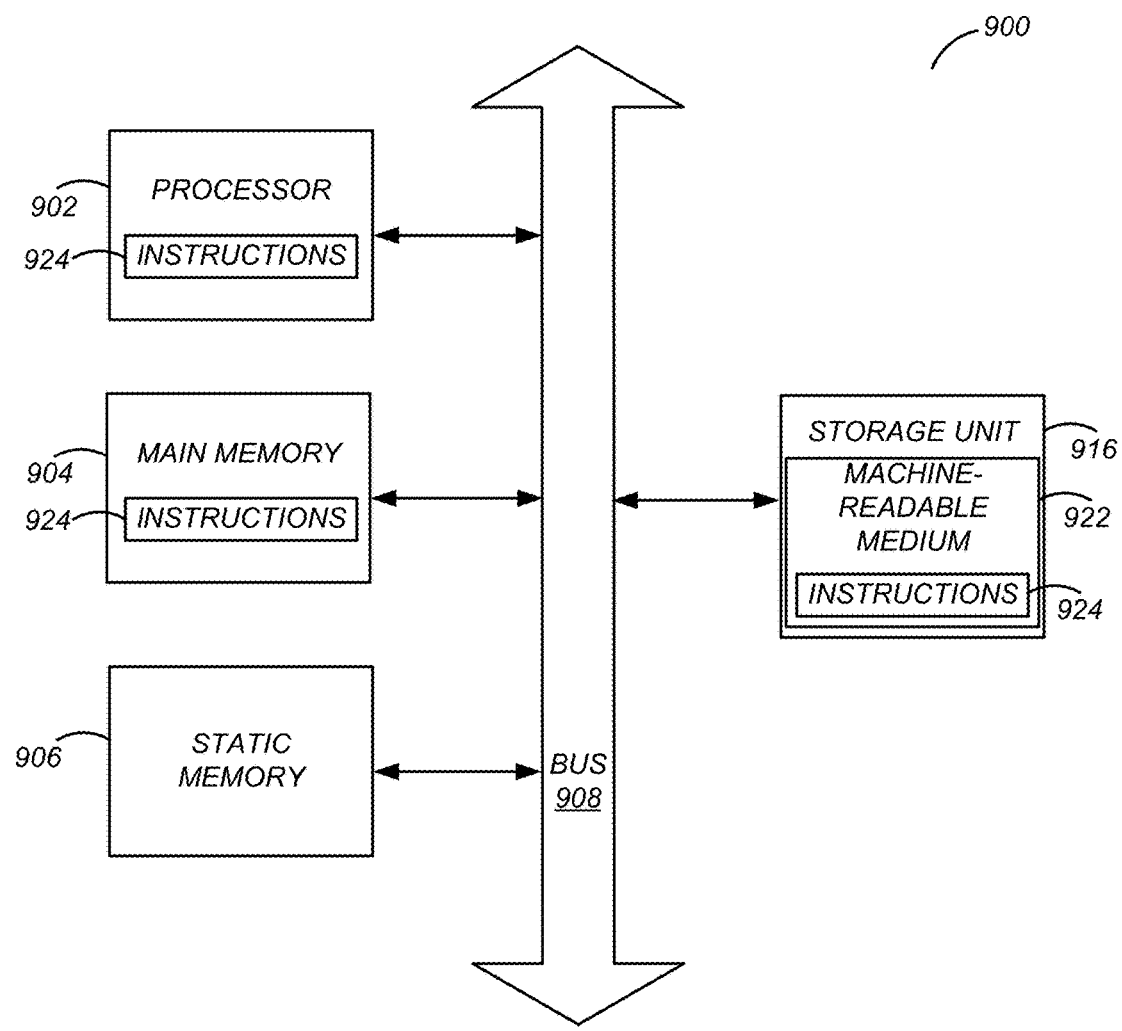
FIG. 9 illustrates one embodiment of components of an example machine able to read instructions from a machine-readable medium and execute them in a processor (or controller).

FIG. 9 is a block diagram illustrating components of an example machine able to read instructions from a machine-readable medium and execute them in a processor (or controller). The layout correction system 1020 is embodied as hardware, software, firmware or a combination thereof by a computer system 900. Specifically, FIG. 9 shows a diagrammatic representation of a machine in the example form of a computer system 900 within which instructions 924 (e.g., software) for causing the machine to perform any one or more of the methodologies discussed herein may be executed. In alternative embodiments, the machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), or any machine capable of executing instructions 924 (sequential or otherwise) that specify actions to be taken by that machine. Further, while only a single machine is illustrated, the term "machine" shall also be taken to include any collection of machines that individually or jointly execute instructions 924 to perform any one or more of the methodologies discussed herein.

The example computer system 900 includes a processor 902 (e.g., a central processing unit (CPU), a graphics processing unit (GPU), a digital signal processor (DSP), one or more application specific integrated circuits (ASICs), a main memory 904, a static memory 906, and a storage unit 916 which are configured to communicate with each other via a bus 908. The processor 902 may include one or more processors. The storage unit 916 includes a machine-readable medium 922 on which is stored instructions 924 (e.g., software) embodying any one or more of the methodologies or functions described herein. The instructions 924 (e.g., software) may also reside, completely or at least partially, within the main memory 904 or within the processor 902 (e.g., within a processor's cache memory) during execution thereof by the computer system 900, the main memory 904 and the processor 902 also constituting machine-readable media.

While machine-readable medium 922 is shown in an example embodiment to be a single medium, the term "machine-readable medium" should be taken to include a single medium or multiple media (e.g., a centralized or distributed database, or associated caches and servers) able to store instructions (e.g., instructions 924). The term "machine-readable medium" shall also be taken to include any medium that is capable of storing instructions (e.g., instructions 924) for execution by the machine and that cause the machine to perform any one or more of the methodologies disclosed herein. The term "machine-readable medium" includes, but not be limited to, data repositories in the form of solid-state memories, optical media, and magnetic media.

Example Usage of the Automatic Layout Modification Tool

Once the design rules and grids/tracks are defined in the technology files needed by the disclosed automatic layout modification tool, the DRC correction and track snapping may be available in the layout editor. A user can launch the correction on the entire layout being edited or portions of it. The correction tool may be implemented in three modes: (1) Fix the entire layout (2) Fix the layout portion visible on the layout canvas (3) Fix the layout inside a user specified rectangular region of the visible layout.

Additional Configuration Considerations

It is noted that although the configurations as disclosed are in the context of EDA for integrated circuit design, the principles disclosed can be applied to an EDA for other hardware or software designs (e.g., printed circuit board design, mechanical structure design, construction blueprint design, 3-D printing design, and etc.) that can include locating positional values with non-uniform grids. Advantages of the disclosed configurations include efficiently identifying and solving infeasibility of set of constraints and using Boolean variables. Such usage of Boolean variables and implications enables a simple 2SAT solver to efficiently identify the infeasibility of set of constraints even with non-uniform structures. Once the infeasibilities are identified, the constraints can be systematically relaxed to obtain a feasible problem. Moreover, such usage of Boolean variables and implications allows constrained optimization problems with two variables per inequality and integrality requirements to be solved using a regular LP solver.

In addition, it is noted that the configurations described correspond to digital representations of physical designs, e.g., circuits manufactured on a chip. Accordingly, the disclosure herein corresponds with transformations associated with processes.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The various operations of example methods described herein, such as those performed by the compiler, may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). In addition, use of the "a" or "an" are employed to describe elements and components of the embodiments herein. This is done merely for convenience and to improve the clarity of this disclosure. This description should be read to include one or at least one and the singular also includes the plural unless it is obvious that it is meant otherwise.

Upon reading this disclosure, those of skill in the art will appreciate a method and system for an automatic layout modification tool with non-uniform grids using Boolean variables through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A computer implemented method of legalizing a circuit layout for manufacturing a circuit, the circuit layout using a plurality of non-uniform grids, the circuit layout comprised of a layout object, the method comprising:
    generating a set of layout constraints for the layout object based on the plurality of non-uniform grids, the set of layout constraints comprising design rule check constraints and gridding requirements, the gridding requirements being requisites for the layout object to align to one of the plurality of non-uniform grids, the layout object having layout variables to identify a position of the layout object;
    processing the set of layout constraints to a feasible form for the layout object to be modified to satisfy the set of layout constraints by:
        assigning Boolean variables to the layout variables, each Boolean variable from the Boolean variables assigned to a corresponding layout variable from the layout variables,
        determining whether the set of layout constraints is infeasible using the Boolean variables assigned to the layout variables, and
        responsive to the set of layout constraints determined to be infeasible, (i) identifying an infeasible layout constraint from the set of layout constraints, the infeasible layout constraint causing the set of layout constraints to be infeasible, and (ii) relaxing the identified infeasible layout constraint for the set of layout constraints to be in the feasible form; and
    generating, by solving the set of layout constraints in the feasible form with a linear program solver, an output circuit layout to provide for manufacture of the circuit.

2. The method of claim 1, wherein identifying the infeasible layout constraint from the set of layout constraints comprises:
    generating a Boolean implication graph based on the Boolean variables, the Boolean implication graph modeling a possible position of the layout object, and
    determining satisfiability of the Boolean implication graph.

3. The method of claim 2, wherein the satisfiability of the Boolean implication graph is determined by identifying strongly connected components of the Boolean implication graph.

4. The method of claim 1, wherein relaxing the identified infeasible layout constraint and determining whether the set of layout constraints is infeasible are performed iteratively until the set of layout constraints is feasible.

5. The method of claim 1, wherein determining whether the set of layout constraints is infeasible using the Boolean variables assigned to the layout variables comprises applying a single source longest path algorithm based on Bellman-Ford algorithm, for detecting positive cycles in the set of layout constraints.

6. The method of claim 1, wherein determining whether the set of layout constraints is infeasible using the Boolean variables assigned to the layout variables comprises computing ranges for a layout rectangle of the layout object by:
   determining a first position for each edge of the layout rectangle by a layout-aware longest path algorithm in a forward run, and
   determining a second position for each edge of the layout rectangle by the layout-aware longest path algorithm in a reverse run.

7. The method of claim 6, wherein determining whether the set of layout constraints is infeasible using the Boolean variables assigned to the layout variables further comprises representing the ranges computed based on the first position in the forward run and the second position in the reverse run, and identifying available grids within the ranges.

8. The method of claim 1, wherein relaxing the infeasible layout constraint comprises:
   replacing a value of the identified infeasible layout constraint restricting the layout object to be placed to a less restrictive value.

9. The method of claim 1, wherein generating the output circuit layout by solving the set of layout constraints in the feasible form with the linear program solver comprises:
   generating a linear program with the set of layout constraints in the feasible form based on the Boolean variables, setting a minimum perturbation objective function, and
   solving the linear program based on the minimum perturbation objective function using the linear program solver.

10. The method of claim 1, wherein generating the output circuit layout by solving the set of layout constraints in the feasible form with the linear program solver comprises translating the Boolean variables into the layout variables indicating the position of the layout object satisfying the set of layout constraints.

11. A non-transitory computer readable medium comprising stored instructions for legalizing a circuit layout using a plurality of non-uniform grids, the circuit layout for manufacturing a circuit, the circuit layout comprised of a layout object, the instructions when executed by a processor causes the processor to:
   generate a set of layout constraints for the layout object based on the plurality of non-uniform grids, the set of layout constraints comprising design rule check constraints and gridding requirements, the gridding requirements being requisites for the layout object to align to one of the plurality of non-uniform grids, the layout object having layout variables to identify a position of the layout object;
   process the set of layout constraints to a feasible form for the layout object to be modified to satisfy the set of layout constraints by causing the processor to:
   assign Boolean variables to the layout variables, each Boolean variable from the Boolean variables assigned to a corresponding layout variable from the layout variables,
   determine whether the set of layout constraints is infeasible using the Boolean variables assigned to the layout variables, and
   responsive to the set of layout constraints determined to be infeasible, (i) identify an infeasible layout constraint from the set of layout constraints, the infeasible layout constraint causing the set of layout constraints to be infeasible, and (ii) relax the identified infeasible layout constraint for the set of layout constraints to be in the feasible form; and
   generate, by solving the set of layout constraints in the feasible form with a linear program solver, an output circuit layout to provide for manufacture of the circuit.

12. The non-transitory computer readable medium of claim 11, wherein the instructions that cause the processor to identify the infeasible layout constraint from the set of layout constraints further comprise instructions that cause the processor to:
   generate a Boolean implication graph based on the Boolean variables, the Boolean implication graph modeling a possible position of the layout object, and
   determine satisfiability of the Boolean implication graph.

13. The non-transitory computer readable medium of claim 12, further comprising instructions that when executed by the processor cause the processor to determine the satisfiability of the Boolean implication graph by identifying strongly connected components of the Boolean implication graph.

14. The non-transitory computer readable medium of claim 11, further comprising instructions that when executed by the processor cause the processor to iteratively relax the infeasible layout constraint and determine whether the set of layout constraints is infeasible until the set of layout constraints is feasible.

15. The non-transitory computer readable medium of claim 11, wherein the instructions that cause the processor to determine whether the set of layout constraints is infeasible using the Boolean variables assigned to the layout variables further comprise instructions that cause the processor to apply a single source longest path algorithm based on Bellman-Ford algorithm, for detecting positive cycles in the set of layout constraints.

16. The non-transitory computer readable medium of claim 11, wherein the instructions that cause the processor to determine whether the set of layout constraints is infeasible using the Boolean variables assigned to the layout variables further comprise instructions that cause the processor to compute ranges for a layout rectangle of the layout object by:
   determining a first position for each edge of the layout rectangle by a layout-aware longest path algorithm in a forward run, and
   determining a second position for each edge of the layout rectangle by the layout-aware longest path algorithm in a reverse run.

17. The non-transitory computer readable medium of claim 16, wherein the instructions that cause the processor to determine whether the set of layout constraints is infeasible using the Boolean variables assigned to the layout variables further comprise instructions that cause the processor to represent the ranges computed based on the first position in the forward run and the second position in the reverse run, and identify available grids within the ranges.

18. The non-transitory computer readable medium of claim 11, wherein the instructions that cause the processor to relax the infeasible layout constraint further comprise instructions that cause the processor to replace a value of the identified infeasible layout constraint restricting the layout object to be placed to a less restrictive value.

19. The non-transitory computer readable medium of claim 11, wherein the instructions that cause the processor to generate the output circuit layout by solving the set of layout constraints in the feasible form with the linear program solver further comprise instructions that cause the processor to:
generate a linear program with the set of layout constraints in the feasible form based on the Boolean variables,
set a minimum perturbation objective function, and
solve the linear program based on the minimum perturbation objective function using the linear program solver.

20. The non-transitory computer readable medium of claim 11, wherein the instructions that cause the processor to generate the output circuit layout by solving the set of layout constraints in the feasible form with the linear program solver further comprise instructions that cause the processor to translate the Boolean variables into the layout variables indicating the position of the layout object satisfying the set of layout constraints.

21. A system for legalizing a circuit layout using a plurality of non-uniform grids, the circuit layout for manufacturing a circuit, the circuit layout comprised of a layout object, the system comprising:
a constraint generation module configured to generate a set of layout constraints for the layout object based on the plurality of non-uniform grids, the set of layout constraints comprising design rule check constraints and gridding requirements, the gridding requirements being requisites for the layout object to align to one of the plurality of non-uniform grids, the layout object having layout variables to identify a position of the layout object;
a constraint process module configured to process the set of layout constraints to a feasible form for the layout object to be modified to satisfy the set of layout constraints, the constraint process module comprising:
a Boolean variable conversion module configured to assign Boolean variables to the layout variables, each Boolean variable from the Boolean variables assigned to a corresponding layout variable from the layout variables,
an infeasibility determination module configured to determine whether the set of layout constraints is infeasible using the Boolean variables assigned to the layout variables, the infeasibility determination module further configured to identify an infeasible layout constraint from the set of layout constraints, responsive to the set of layout constraints determined to be infeasible, the infeasible layout constraint causing the set of layout constraints to be infeasible, and
a constraint relaxation module configured to relax the identified infeasible layout constraint for the set of layout constraints to be in the feasible form, responsive to the set of layout constraints determined to be infeasible; and
an output layout generator module configured to generate by solving the set of layout constraints in the feasible form with a linear program solver, an output circuit layout to provide for manufacture of the circuit.

22. The system of claim 21, wherein the constraint process module further comprises an implication graph generation module configured to generate a Boolean implication graph based on the Boolean variables, the Boolean implication graph modeling a possible position of the layout object, and
wherein the infeasibility determination module is configured to determine satisfiability of the Boolean implication graph to determine whether the set of layout constraints is infeasible.

23. The system of claim 22, wherein the infeasibility determination module comprises a 2SAT solver configured to determine the satisfiability of the Boolean implication graph by identifying strongly connected components of the Boolean implication graph.

24. The system of claim 21, wherein the constraint process module is configured to iteratively relax the identified infeasible layout constraint and determine whether the set of layout constraints is infeasible until the set of layout constraints becomes feasible.

25. The system of claim 21, wherein the constraint process module further comprises a range identification module configured to compute an allowable range for a layout rectangle of the layout object by (i) determining a first position for each edge of the layout rectangle by a layout-aware longest path algorithm in a forward run, and (ii) determining a second position for each edge of the layout rectangle by the layout-aware longest path algorithm in a reverse run.

26. A non-transitory computer readable medium comprising stored instructions for legalizing a circuit layout using a plurality of non-uniform grids, the circuit layout for manufacturing a circuit, the circuit layout comprised of a layout object, the instructions when executed by a processor cause the processor to:
generate a set of layout constraints for the layout object based on the plurality of non-uniform grids, the layout object having layout variables to identify a position of the layout object;
assign Boolean variables to the layout variables;
determine whether the set of layout constraints is infeasible using the Boolean variables assigned to the layout variables;
responsive to the set of layout constraints determined to be infeasible, modify a portion of the set of layout constraints; and
generate, based at least in part on the modified set of layout constraints, an output circuit layout to provide for manufacturing the circuit.

27. The non-transitory computer readable medium of claim 26, wherein the instructions that cause the processor to modify the portion of the set of layout constraints further comprise instructions that cause the processor to: identify an infeasible layout constraint from the set of layout constraints, the infeasible layout constraint causing the set of layout constraints to be infeasible; and relax the identified infeasible layout constraint.

28. The non-transitory computer readable medium of claim 27, wherein the instructions that cause the processor to identify the infeasible layout constraint from the set of layout constraints further comprise instructions that cause the processor to:
generate a Boolean implication graph based on the Boolean variables, the Boolean implication graph modeling a possible position of the layout object, and determine satisfiability of the Boolean implication by identifying strongly connected components of the Boolean implication graph.

* * * * *